United States Patent [19]

Keren et al.

[11] Patent Number: 5,256,972
[45] Date of Patent: Oct. 26, 1993

[54] BODY COIL DECOUPLING CIRCUIT

[75] Inventors: Hanan Keren, Kfar Saba; Noam Shalev; Zeev Harel, both of Natanya, all of Israel

[73] Assignee: Elscint, Ltd., Haifa, Israel

[21] Appl. No.: 3,877

[22] Filed: Jan. 12, 1993

Related U.S. Application Data

[63] Continuation of Ser. No. 647,928, Jan. 30, 1991, abandoned.

[30] Foreign Application Priority Data

Jan. 30, 1990 [IL] Israel .................................. 93214

[51] Int. Cl.$^5$ ............................................ G01V 3/00
[52] U.S. Cl. ..................................... 324/318; 324/322
[58] Field of Search ............... 324/300, 307, 309, 318, 324/322; 128/653.5

[56] References Cited

U.S. PATENT DOCUMENTS

| | | | |
|---|---|---|---|
| 4,620,155 | 10/1986 | Edelstein | 324/318 |
| 4,757,290 | 7/1988 | Keren | 333/219 |
| 4,782,298 | 11/1988 | Arakawa et al. | 324/318 |
| 4,820,987 | 4/1989 | Mens | 324/318 |

*Primary Examiner*—Louis Arana
*Attorney, Agent, or Firm*—Sandler Greenblum & Bernstein

[57] ABSTRACT

A system for decoupling the body coil of the magnetic resonance imaging system when surface coils are used, and especially when the surface coils are used only for receiving. Semi-conductor switches; i.e., diodes are used in the body coil to decouple the body coils. However, gradient generated transients often erroneously switch off the diodes which are then destroyed by a subsequent transmitted RF signal. The invention provides fail safe circuitry for preventing RF transmission when the diode switches are in the non-conducting condition.

11 Claims, 3 Drawing Sheets

BODY COIL DECOUPLING CIRCUIT

This application is a continuation of application Ser. No. 07/647,928, filed Jan. 30, 1991, now abandoned.

FIELD OF THE INVENTION

This invention is concerned with magnetic resonance (MR) systems and more particularly to circuitry for coupling and decoupling body coils used in such systems especially when the body coils are used for transmitting and passive coils are used for receiving. By passive coils, included herein are surface coils, limb coils, spine array coils and other coils used for receiving signals from the subject and not for transmitting RF pulses to the subject.

BACKGROUND OF THE INVENTION

Magnetic resonance systems used for medical diagnostic purposes comprise a magnet for providing a strong homogeneous static magnetic field. The magnet is large enough to receive a patient therein. Radio frequency (RF) coils are provided in such systems to transmit RF pulses toward spins aligned with the static magnetic field. The RF pulses at the Larmor frequencies are transmitted into the RF coils of such systems to nutate or "tip" the spins into a plane orthogonal to the large static magnetic field. The spins in the orthogonal plane generate free induction decay (FID) signals or depending on the scan sequence, echo signals. It is the FID and/or echo signals that are used for diagnostic purposes.

The signals received from the spins in the patient are very small. To improve the signal-to-noise ratio, many different types of surface coils; i.e., coils that are placed adjacent to the skin surface of the patient are used. These coils in general are used merely for receiving purposes. Thus, the body coils that are used for transmitting must be quickly decoupled after having generated an RF magnetic field so as not to disturb the detection of the generated spin resonance signals by the surface coils.

To this end, it is well known in the prior art to use semi-conductor switches such as diodes in the RF body coil to decouple the body coil. A particularly useful body coil is the one disclosed in U.S. Pat. No. 4,757,290 issued Jul. 12, 1988. It is well known to place the diodes at zero crossing points in the conductors of the RF body coil so that the semi-conductor switches are operable with low voltage.

Control circuitry is generally used to control the body coil so that no transmitted signal is sent while the diodes are turned off responsive to signals from decoupling control circuitry. It is known that if the RF pulses are transmitted while the diodes are turned off, the diodes are liable to "burn out".

One of the problems of prior art circuitry for controlling the decoupling of the body coils, i.e., for switching the body coil diodes on and off is that transients, such as transients which may be caused when a gradient coil malfunctions have been known to switch the diodes to the off condition even when the control circuit has the diodes biased to the "on" condition. Subsequently, RF pulses placed across the diodes can seriously damage the diodes.

Thus, it is an object of the present invention to provide control circuitry for selectively decoupling body coils and for preventing the transmission of RF pulses whenever the body coil is decoupled; i.e., whenever the diode switches are turned off regardless of whether they are turned off due to high transients or turned off responsive to the signals from the decoupling control circuitry.

BRIEF DESCRIPTION OF THE INVENTION

In accordance with a broad aspect of the present invention, a body coil decoupling circuit is provided for decoupling the body coil of a magnetic resonance (MR) system from the system, said circuit comprising:

a switch in each loop of the body coil, said switches having a conducting condition and a non-conducting condition, means for maintaining said switches in the conducting condition, means for switching said switches to the non-conducting condition to decouple said body coil, said means for maintaining said switches in the conducting condition comprising means responsive to a body coil being used for receiving signals from a patient being examined in the MR system for maintaining said switches in the conducting condition, and means responsive to passive coils being used for receiving signals from the patient for operating said means for switching to the non-conducting condition when receiving signals from said patient.

In accordance with a feature of the present invention means are provided for preventing the transmission of RF pulses to the body coil while the body coil is decoupled regardless of whether the decoupling is intentional or unintentional.

According to yet another feature of the present invention, a circuit for decoupling a body coil in an MR system from transmitter and receiver means in the MR system is provided, said circuit including:

diode means for selectively opening the circuit of the body coil for preventing conductance of current through said body coil, means for detecting the opening of the circuit by said diode means, and means responsive to the detection of an open circuit for preventing transmission of radio frequency pulses to said body coil means to thereby safeguard said diode means.

BRIEF DESCRIPTION OF THE DRAWINGS

The above mentioned and other features and objects of the present invention will be best understood when considered in the light of the following description of a broad aspect of the present invention made in conjunction with the following drawings, wherein.

GENERAL DESCRIPTION

Figure 1:
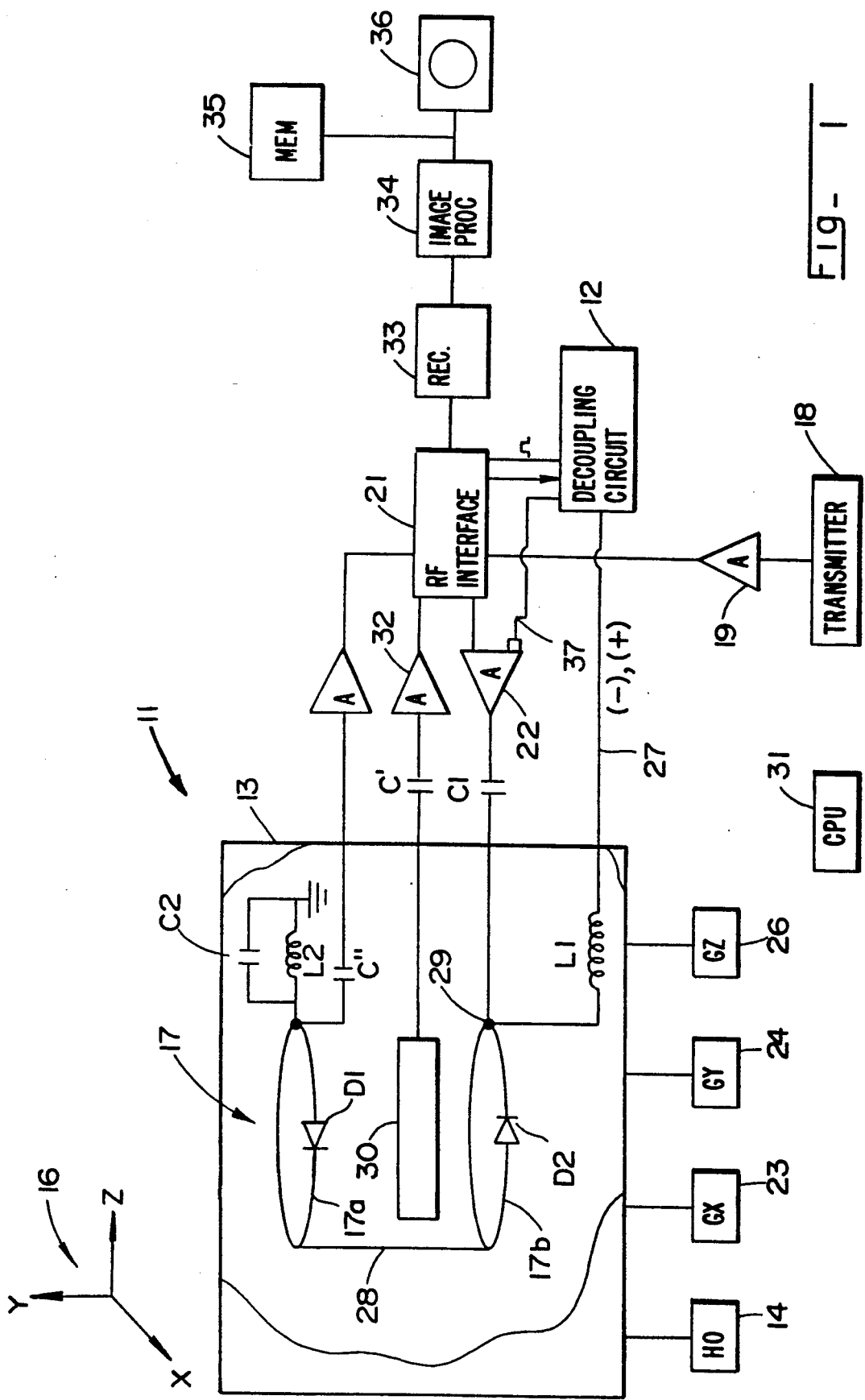
FIG. 1 is a block diagram showing of a typical magnetic resonance system but including the inventive decoupling circuitry.

FIG. 1 at 11 shows a typical magnetic resonance system used for imaging or spectroscopic purposes except, however, the system 11 includes a unique decoupling circuit 12. The magnetic resonance system 11 includes the large magnet 13 used to create a large static magnetic field responsive to the operation of the magnetic field current generator 14. As is well known, the large static magnetic field aligns spins in a patient (not shown) placed within the bore of the magnet with the large static magnetic field.

The large static magnetic field is assumed to be in the direction of the Z axis of the XYZ orthogonal axes system shown at 16. The aligned spins are nutated or tipped into a plane orthogonal to the axis of alignment of the main magnetic field responsive to radio frequency (RF) pulses applied to a body coil 17 portions of which are shown at 17a and 17b. The RF pulses are generated by a transmitter 18 and sent through an RF amplifier 19 into an RF interface circuit 21. In the RF interface circuit, the RF frequency is modulated by a pulse shaper, among other things. The pulse modulated RF signal from the RF interface is transmitted through an RF power amplifier 22 to the body coil 17. A DC blocking capacitor C1 is in the series connection between amplifier 22 and the body coil 17.

As is well known, when the spins are nutated to an orthogonal plane such as the XY plane, the tipped spins generate FID signals. To determine the locations of the FID signals, magnetic gradients are applied to the large static magnetic field. For example, a slice selecting gradient is generated by gradient generator Gz shown at 23. A phase encoding gradient is applied by operating the phase encoding generator Gy shown at 24. A view of read gradient is applied by operating the read gradient generator Gx shown at 26.

Means are provided for controlling the upper loop 17a of the body coil 17 to provide conducting and non-conducting conditions of the loop. Similarly, means are provided for controlling the lower loop 17b of the body coil 17 to provide a conducting and a non-conducting state of the lower loop. The preferred means as shown in FIG. 1 is diode D1 in the upper loop 17a and diode D2 in the lower loop 17b.

Figure 2:
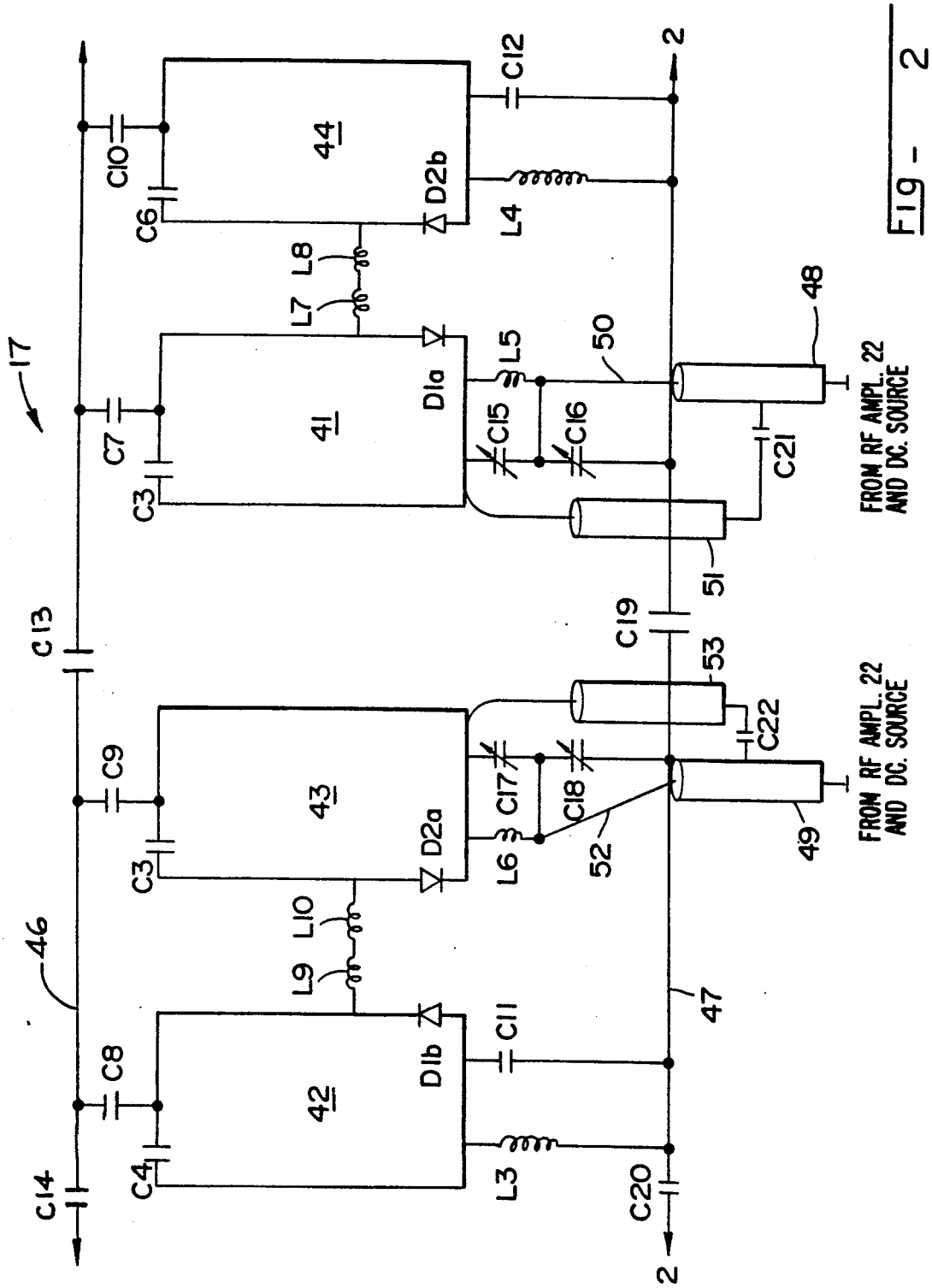
FIG. 2 is an unrolled or laid out showing of a radio frequency (RF) body coil including a decoupling means.

Means are provided for biasing diodes D1 and D2 into selectively conducting or non-conducting conditions. More particularly, DC voltages from decoupling circuit 12, are extended to the body coil. It must be understood that the showing of the switching diodes in FIG. 1 is strictly schematic. A more detailed and accurate showing of the actual diode circuitry as used is shown in FIG. 2, for example.

A DC voltage from the decoupling circuit 12 is shown as being connected through conductor 27, AC blocking inductor L1 and a junction point 29 to the bottom of loop 17b of the RF body coil 17. The bottom loop includes diode D2. The bottom loop is coupled to the top loop through conductor 28.

The top loop 17a of body coil 17 includes diode D1. The top loop DC is coupled to ground through inductor L2 which is parallel to a capacitor C2. Thus, a negative DC voltage that is applied through conductor 27 to the body coil loops biases the diodes D1 and D2 into the conducting state. When the diodes D1 and D2 are in the conducting state then RF pulses applied from amplifier 22 through capacitor C1 to the loops of the body coil are conducted through the body coils and to ground through a capacitor C2.

Responsive to the RF in the body coil, the aligned spins are tipped into the XY plane, or at least a projection of the spins are tipped into the XY plane. This generates an FID signal or depending on the scan sequence being used, echo signals may be generated in a well known manner. Hereinafter FID and/or echo signals are referred to as "signals", or "FID signals".

To detect the signals, a passive surface coil shown at 30 may be utilized. The benefit of surface coils are well known and described in many patents, and applications, such as the U.S. Pat. No. 4,928,064 which issued May 27, 1990. During the time that the passive surface coil 30 is receiving, the diodes D1 and D2 of the body coil are switched to the non-conducting condition by the decoupling circuit under the control of the control processing unit (CPU) 31. CPU 31 controls the amplitudes and the timing of control signals, of the RF pulses and of the gradients of the MR system. The CPU is thus connected to all of the components of the MRI system. In the interest of clarity, connections to each of the components from the CPU are not shown.

The generated FID signals are detected by the passive surface coil 30. The detected signals are amplified in the preamplifier 32 and transferred to the RF interface 21. The signals are transferred by the RF interface to receiver circuitry 33 and from the receiver go to an image processor 34 which includes a Fourier transform circuit for converting the time based signals received to frequency based signals that are stored as intensities in memory 35 comprising a matrix of areas corresponding to pixels in the image. The intensities stored in memory unit 35 are subsequently transferred to the display unit 36 to form an image.

A problem is that the diodes may decouple the RF coils responsive to transient signals received by the body coil. Thus, for example, if a gradient coil fails, a large DC transient is generated. This large transient could decouple the diodes; i.e., could switch the diodes to the non-conducting condition. When an RF transmitted pulse is placed on the loops while the diodes are in the non-conducting condition, the diodes could be destroyed. Accordingly, means are provided to prevent the destruction of the diodes by RF pulses when they are turned off responsive to a transient pulse such as that generated responsive to the failure of a gradient coil.

More particularly, means are provided for preventing the transmitted RF pulse from reaching the body coil. The means includes the lack of an enabling signal on conductor 37 transmitted from the RF interface 21 to amplifier 22 responsive to an open diode or non-conducting diode in the body coil. Then, even if the transient switches the diodes to the non-conducting condition, the failure to enable amplifier 22 prevents any RF pulses from being applied to the body coil and thus prevents the destruction of the diodes. After the transient has passed and the diode conducts, then the enabling signal may be returned to conductor 37.

When an RF pulse is to be transmitted, the RF interface sends a blank-in signal DC pulse to the decoupling circuit. However, the blank-in pulse in conjunction with a non-conducting diode prevents an enabling signal from being sent on conductor 37 to amplifier 22; thereby, inhibiting the transmission of the RF pulses received from the RF interface 21 by amplifier 22. In a preferred embodiment the blank-in pulse is 5 volts DC.

Thus, as seen in the block diagram of FIG. 1, the decoupling circuit 12 performs at least two major functions:

1) it controls the conductivity of diodes in the body coil loops, and;
2) it controls the transmission of the RF pulses to the body coil.

No RF pulses are transmitted even though body coil enable signals are applied to the body coil to switch on the diodes if a diode in any of the body coil loops is in the non-conducting state, due to transients, for example.

FIG. 2 is a showing of the body coil disclosed and described in detail in the above noted U.S. Patent. The showing in FIG. 2 is a rolled out version of the body coil. As shown therein, the body coil comprises four body coil loops: an upper or top loop 41 and a bottom loop 42 as well as a left side loop 43 and a right side loop 44. The loops are coupled together by a top conductor 46 and a lower conductor 47. Each of the loops includes a series capacitor, such as capacitor C3 in loop 41, capacitor C4 in loop 42, capacitor C5 in loop 43 and capacitor C6 in loop 44. Similarly, each of the loops are coupled to the top conductor through a capacitor; such as capacitor C7 connecting loop 41 to conductor 46, capacitor C8 connecting loop 42 to conductor 46, capacitor C9 connecting loop 43 to conductor 46 and capacitor C10 connecting loop 44 to conductor 46. The bottom loop 42 is shown coupled to the bottom conductor 47 through the parallel combination of capacitor C11 and inductor L3. The right hand loop 44 is shown coupled to the bottom conductor 47 through the parallel combination of capacitor C12 and inductor L4.

A pair of series capacitors are in the top conductor 46. More particularly, capacitor C13 is serially connected in conductor 46 between the junction point of capacitor C7 with conductor 46 and the junction point of capacitor C9 with conductor 46. Similarly, capacitor C14 is serially connected in conductor 46 between the junction points of capacitor C8 and conductor 46 and capacitor C10 and conductor 46.

Upper loop 41 is shown connected to conductor 47 through a pair of series capacitors C15 and C16. An inductor L5 bridges capacitor C15. Similarly, lower loop 43 is coupled to conductor 47 through a pair of series capacitors C17 and C18. An inductor L6 is shown bridging capacitor C17.

A pair of series capacitors are connected in conductor 47. More particularly, a capacitor C19 is serially connected in the conductor 47 between the junction points of capacitors C16 and conductor 47 and the junction point of capacitor C18 and conductor 47. A second capacitor C20 is serially connected in conductor 47 between the junction points of capacitor C11 and inductor L3 to conductor 47 and the junction point of capacitor C12 and inductor L4 to conductor 47.

Means are provided for coupling the decoupling circuit to the body coil. More particularly, means are provided for coupling the upper loop 41 and the left hand loop 43 to the decoupling circuit 12 through shielded cable conductors 48 and 49 respectively.

Means are provided for selectively switching each of the loops into either a conducting state or a non-unconducting state. More particularly, diode D1a is shown in loop 41, diode D1b is shown in loop 42, diode D2a is shown in loop 43 and diode D2b is shown in loop 44. These diodes are placed at node points in the loop; i.e., points of minimal current. Each of the conductors 48 and 49 carries both RF pulses when the system is in the transmit state and DC for switching the diodes when it is desired to switch the diodes. When it is desired that the diodes be in the conducting condition, then DC current is sent on over the middle conductor 50 of shielded conductor 48 to the junction point of inductor L5, capacitor C15 and capacitor C16. The RF current goes through the capacitor C15 to loop 41 and it goes through the loops in the manner explained in detail in the above noted patent. The DC current travels over conductor 50 through inductor L5, diode D1a, inductors L7 and L8 in series to loop 44, through diode D2b, inductor L4 and to conductor 47 which is grounded and coupled to the shield of shielded conductor 48.

Similarly, the DC carried by shielded conductor 49 travels through the center conductor 52 of shielded conductor 49 to the junction point of inductor L6, capacitor C17 and capacitor C18. From the junction point, the DC goes through inductor L5, diode D2a and the series inductors L9 and L10 connecting loop 43 to loop 42. On loop 42, the DC current travels through diode D1b to inductor L3 and conductor 47 connected to ground at the shield of shielded conductor 49.

Conductors 51 and 53 are shown connected between loops 41 and conductor 48 and loop 43 and conductor 49 respectively. For a more detailed explanation of the operation of conductors 51 and 53 see Israeli Patent Application Ser. No. 082,658 filed on May 26, 1987. A blocking capacitor C21 is between the conductor 51 and the shield of conductor 48. Similarly, a blocking capacitor C22 is located between conductor 52 and the shield of conductor 49. The blocking capacitors C21 and C22 prevent DC currents on the loops 41 and 43 from being shorted to the shields of conductors 48 and 49 respectively.

When it is desired that the diodes be non-conductive; i.e., the loops be decoupled, the diodes are turned off by positive DC from conductors 48 and 49. The diodes are switched to the conducting state by negative DC voltage applied through conductors 48 and 49.

The diodes D1 and D2 are positioned at the nulls in the loops to assure operation of the diodes at low voltages. In addition the DC loop components are positioned to minimize the length of the DC control circuits. This minimizes eddy current and reverse EMF effects.

As shown in FIG. 1, the operating voltage for switching the diodes between the conducting and non-conducting state comes from the decoupling circuit 12. It is, of course, the RF interface which sends voltages to the decoupling circuit under the control of the CPU unit 31 of FIG. 1.

Figure 3:
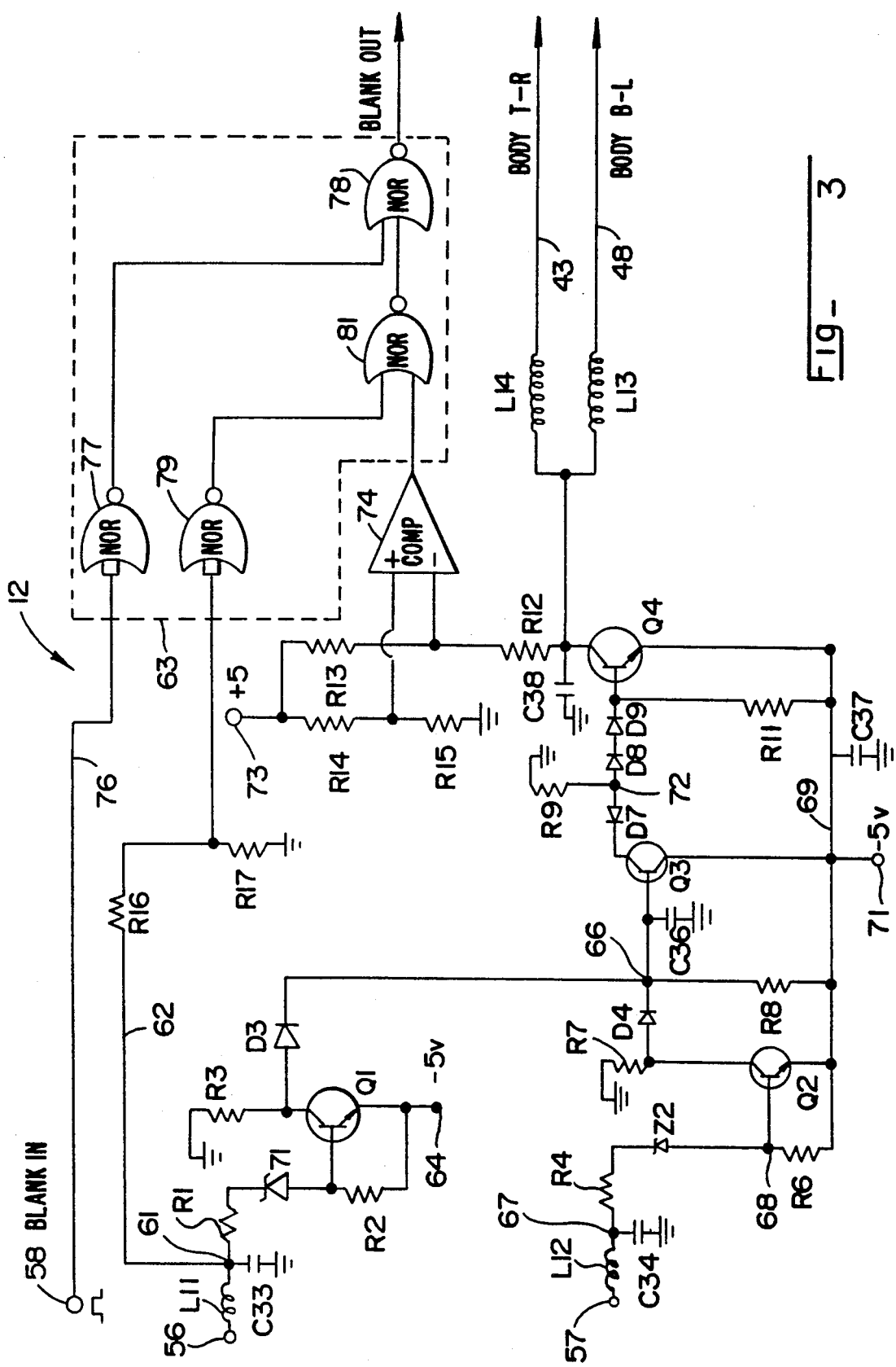
FIG. 3 shows details of a preferred embodiment of a decoupling circuit.

A preferred embodiment of the logic for operating the body coil and for assuring that no RF is transmitted when a transient causes diodes of the body coil to be in an non-conducting condition is shown in FIG. 3.

A body coil enabled terminal 56 is shown in FIG. 3. Whenever the body coil is to be used, the terminal 56 has a positive DC voltage applied thereto. In a preferred embodiment +15 V DC is applied. Whenever the body coil is not to be enabled, a zero voltage (floating) is applied to terminal 56. As shown in FIG. 3 when the body coil is to receive; then, the body coil receive enabled terminal 57 is also supplied a positive voltage. In a preferred embodiment positive 15 volts is used. When the body coil is not be used, then a slight negative voltage is applied to the terminal 57. In a preferred embodiment −1.5 voltage is used. The body coil is not used for receiving when passive coils are used for receiving. The body coil is not used for receiving or transmitting when head coils are used.

Blank-in DC pulses for controlling the transmittal of RF pulses are applied to terminal 58. The blank-in pulses and DC voltages are received from the RF interface under the control of CPU 31. The blank-in pulses normally enable the RF amplifier 22. In the absence of the blank-in pulse there is no output from amplifier 22 and hence no RF pulses are transmitted.

Assume that the body coil is being used for transmission and a positive 15 volts DC is applied to the terminal 56. The positive DC voltage passes through an inductor L11 to a junction point 61. The junction point 61 is connected to ground through a filter capacitor C33. Also connected to junction point 61 is a conductor 62 which goes to logic circuitry, 63 for selectively applying control signals for controlling the output of the RF amplifier 22.

The positive voltage on terminal 56 is applied to the base of an NPN transistor Q1 through a zener diode Z1. The zener diode regulates the positive voltage applied to the base of transistor Q1. A negative voltage bias is applied to the emitter of the transistor Q1 from a negative voltage terminal 64. A negative 5 volts is used in a preferred embodiment. Biasing resistors R1 and R2 are connected between the junction point 61 and the negative voltage terminal 64 in series with the zener diode Z1. The base of transistor Q1 is connected to the negative voltage terminal through the junction of zener diode Z1 and resistor R2.

The collector of transistor Q1 is connected to ground through a resistor R3. The anode of a positive-going diode D3 is connected to the junction of the collector of transistor Q1 and resistor R3. Its cathode is coupled to a junction point 66.

The body coil receive enabled terminal 57 similarly is connected through an inductor L12 to a junction point 67. The junction point 67 is the junction of inductor L12 and a resistor R4. The junction point 67 is coupled to ground through a filter capacitor C34. The other end of resistor R4 is coupled in series with a Zener diode Z2 to a junction point 68 connected to the base of NPN transistor Q2. The base of the transistor is also coupled from junction point 68 through resistor R6 to the negative voltage bus 69. The emitter of the transistor Q2 is connected through the bus 69 to a negative voltage battery shown at 71. In a preferred embodiment, the voltage at 71 is −5 volts.

The collector of transistor Q2 is connected to ground through resistor R7 and to junction point 66 through a diode D4 coupled to the junction of the collector and resistor R7.

The junction point 66 is coupled to the base of an NPN transistor Q3. The base of the transistor Q3 is coupled to ground through a filter capacitor C36. Junction point 66 is connected to the negative voltage bus 69 through resistor R8. The emitter of transistor Q3 is connected to the negative voltage bus 69. The collector of the transistor Q3 is connected through a negative going diode D7 to a junction point 72. The junction point 72 is coupled to ground through resistor R9. The diode D7 has its cathode coupled to the collector of transistor Q3 and its anode connected to the side of resistor R9 away from ground.

Also connected to junction point 72 is the base of the transistor Q4. The connection between junction point 72 and the base of transistor Q4 goes through a pair of series connected, positive going diodes D8 and D9; i.e., the anode of diode D8 is connected to junction point 72. The cathode of diode D8 is connected to the anode of diode D9. The cathode of diode D9 is coupled to the base of NPN transistor Q4. The base of transistor Q4 is also coupled to the negative voltage bus 69 through a resistor R11. The emitter of transistor Q4 is connected directly to the negative bus 69. A filter capacitor C37 is connected between the negative bus 69 and ground. The collector of the transistor Q4 is connected through a filter capacitor C38 to ground. The collector of transistor Q4 is also connected through an RF blocking inductor L13 to the shielded conductor 48 and through an RF blocking inductor L14 to the shielded conductor 49. Both conductors 48 and 49 are coupled to the body coil. The collector of transistor Q4 is connected through a pair of series resistors R12 and R13 to positive voltage at terminal 73. In a preferred embodiment, the positive voltage is 5 volts.

The positive voltage terminal is connected to ground through a pair of resistors R14 and R15 in series. The junction of resistors R14 and R15 is coupled to the positive input of a comparator circuit 74. The junction of resistors R12 and R13 is connected to the negative input of the comparator circuit 74. The output of the comparator circuit 74 goes to the logic unit 63. Conductor 62 also is connected to the logic unit 63 through a series resistor R16. The resistor R16 is part of a voltage divider including resistor R17 connected to ground.

The blank-in DC pulse that normally goes directly to the RF amplifier is connected instead to terminal 58 of the decoupling circuit 12. The DC pulse goes from terminal 58 over conductor 76 to the logic circuit 63. More particularly, this blank-in pulse goes to both inputs of a first NOR gate 77. The NOR gate gives "0" (low) output responsive to an input "1" (high) on each of its input terminals or on either of its input terminals. It gives an output "1" (high) responsive to no inputs "0" (low) on each of its input terminals. Thus when the blank-in signal is on, then the output of NOR gate 77 is zero. When there is no blank-in signal, the output of NOR gate is "1". The output of NOR gate 77 is connected to one input of a NOR gate 78. The junction of the resistors R16 and R17 is connected to both inputs of the NOR gate 79. Thus, when there is a positive voltage on conductor 62 (i.e., the body coil enable signal is present) the output of NOR gate 79 is zero.

The output of the NOR gate 79 is connected to one input of another NOR gate 81. The other input of NOR gate 81 comes from the comparator circuit 74.

The comparator circuit operates so that when the value of the positive input is larger than the value of the negative input, then there is an output (high); i.e., the output is "1". When the value of the negative input is larger than the value of the positive input, then the output is "0" (low). Thus, the comparator is a means for determining if the body coil loop switches are conducting or non-conducting. When a loop is in the non-conducting state the negative input to the comparator is greater than its positive input giving a "0" output. When a loop is in the conducting state, the comparator output is "1".

When the output of the comparator circuit 74 is "0" and there is a body coil enable signal applied, then the output of the NOR gate 81 is "1". When the output of NOR gate 81 is "1" and a blank-in pulse is present, then the output of NOR gate 78 is "0" and a blank-out or RF amplifier enable signal is not sent to enable the RF signals. When the output of comparator 74 is "1" (loop conducting) and a body coil enable signal is applied, then the output of NOR gate 81 is "0" and the output of gate 78 is "1" and an RF amplifier enable signal is sent.

Thus, in operation the decoupling circuit 12 of FIG. 3 controls the DC switching voltages applied to the body coil. In addition, the decoupling circuit 12 controls the blank-out pulse which enables the RF amplifier to transmit RF pulse. The enable signal is sent only if the switches in the body coil loops are conductive.

Thus, when a transient has been induced in the RF coil sufficient to turn off the diodes in the body coil, the amplifier is not enabled.

More particularly, in a preferred embodiment when the body coil is to be used, a +15 volt enable signal is applied to terminal 56. This +15 volt signal causes the transistor Q1 to saturate. When transistor Q1 saturates the diode D3 is blocked and no signal passes through diode D3.

When no passive coils are used for receiving then +15 volts is applied to terminal 57. This causes transistor Q2 to saturate. When transistor Q2 saturates no signal goes through diode D4.

When no signal goes through either diodes D3 or D4, then negative 5 volts is applied to the base of transistor Q3 and transistor Q3 is not saturated. When transistor Q3 does not saturate diode D7 does not conduct and ground is applied to the base of transistor Q4 through diodes D8 and D9 so that transistor Q4 is saturated. When transistor Q4 is saturated negative voltage is applied to the diodes in the body coil causing those diodes to conduct. Negative voltage is also applied to R12 reducing the voltage at the negative input of the comparator. When both transistor Q1 and transistor Q2 are saturated, then transistor Q3 is saturated. When transistor Q3 is saturated transistor Q4 does not saturate. When transistor Q4 does not saturated then positive voltage is applied to shielded conductors 48 and 49 thereby turning off the diodes in the body coil and increasing the value of the negative input of the comparator 74. The output of the comparator is then low.

When the diodes in the body coil are conducting, then the comparator provides an output "1" (i.e., the positive input is larger than the negative input). Then the output of NOR gate 81 is "0" and the output of NOR gate 78 is "1", enabling the RF amplifier as long as a blank-in pulse is applied to terminal 58.

When the diodes in the body coil are not conducting due to a transient, then the negative input to the comparator is larger than the positive input and the output of comparator 74 is "0". When the output of comparator 74 is "0", then the output of NOR gate 81 is "1" and the output of NOR gate 78 is "0" so no blank-out signal is produced and the RF amplifier is not enabled and no RF pulses are transmitted by the RF amplifier.

Assume that the body coil is used for transmitting and a passive coil is used for receiving. During transmission the terminal 56 is supplied with a +15 volt signal. This causes transistor Q1 to saturate. A positive 15 volts is applied to terminal 57 which causes transistor Q2 to saturate. Transistor Q3, therefore, cannot saturate because its base is negative relative to its collector.

When transistor Q3 does not saturate, then transistor Q4 saturates and creates a circuit from positive voltage to negative voltage with portions applied to the inputs of the comparator circuit 74. When the body coil diodes are conducting, the output of the comparator circuit 74 is "1". When the body coil diodes are not conducting, the output of the comparator circuit is "0".

In a preferred embodiment, the components used had the following values:

| | |
|---|---|
| R1 = 1K ohms | C33, C34, C36, C37, C38 = 620PFD |
| R2 = 10K ohms | L11, L12, L13, L14 = 10 mhy. |
| R3 = 1K ohms | Comparator 74 is an LM324N (Motorola) |
| R4 = 470K ohms | Circuit 63 is a 74LS02 (Motorola) |

| | |
|---|---|
| R6 = 10K ohms | Voltages: Terminal 56 +15 Volts DC or 0 Volts (floating) |
| R7 = 510K ohms | Terminal 57 +15 Volts |
| R8 = 10K ohms | DC or −1.5 V DC |
| R9 = 68K ohms (0.5 w) | Terminal 58 +5 Volts |
| R11 = 10K ohms | DC pulse |
| R12 = 2.7K DC | Terminal 64 −5 V DC |
| R13, R14, R15 = 1.2K ohms | Terminal 71 −5 V DC |
| R16 = 2K ohms | Terminal 73 +5 V DC |
| R17 = 1K ohms | Transistors Q1-Q3 are MPSA06 |
| | Transistor Q4 TIP41C |
| | Zener diodes Z1, Z2 are IN965a |
| | Diodes D1, D1A, D2, D2a are UM4010b |
| | Diodes D3, D4, D7, D8 and D9 are IN914 |

While the invention has been described in connection with certain embodiments it should be understood that these embodiments are exemplary only and should not be considered in any way as limiting the scope of the invention.

What is claimed is:

1. A circuit for decoupling the body coil of a magnetic resonance (MR) system from the system, said MR system comprising:
    a large magnet including an opening for receiving a patient therein to subject the patient to a large static magnetic field,
    said body coil included in said magnet,
    said body coil including a plurality of oppositely disposed loops,
    X, Y and Z gradient coils included in said magnet,
    a transmitter for transmitting radio frequency (RF) pulses through said body coil,
    a receiver for receiving free induction decay (FID) signals from said body coil,
    an image processor for using said received signals to provide a display image,
    said circuit for decoupling the body coil of the MR system from the system comprising:
    a switch in each loop of said plurality of loops of said body coil,
    said switches having a conducting condition and an non-conducting condition,
    means for normally maintaining said switches in the conducting condition to couple said body coil to said system,
    means for switching said switches to the non-conducting condition to decouple said body coil from said system,
    said means for maintaining said switches in the conducting condition comprising means responsive to said body coil being used for receiving FID signals from a patient being examined in the MR system,
    means responsive to passive coils being used for receiving FID signals from the patient for operating said means for switching to the non-conducting condition, and
    means for enabling the transmitter to transmit RF pulses to the body coil only when the body coil is coupled to the system.

2. The circuit of claim 1 for decoupling said body coil from said MR system wherein:
    said means for decoupling said body coil comprises:
    diode switch means in said body coil, and
    logic means for selectively switching said diode switch means to the conducting or non-conducting condition.

3. The circuit of claim 2 wherein said logic means comprises.
- transistor means operated responsive to a body coil switching signal to provide DC bias voltage to switch said diode switch means to the conducting condition, and
- means responsive to said diode switch means being in the conducting condition for enabling said RF amplifier to transmit said RF pulses to said body coil means.

4. The circuit of claim 2 for decoupling said body coil wherein said logic means comprises:
- a first transistor operated to the conducting condition responsive to said body coil switching signal,
- a second transistor normally in saturation operated to a non-saturated condition responsive to the operation of said first transistor to the conducting condition.
- a third transistor operated to saturation responsive to said second transistor being operated to a non-saturated condition, and
- means responsive to said third transistor operated to the saturated condition for biasing said diode switch means to the conducting condition.

5. The circuit of claim 4 including comparator means for providing an output "1" when said diode switch means is in the conducting condition, and
- gate logic means operated responsive to the output of said comparator means for providing an enable signal to said RF amplifier.

6. The circuit of claim 5 wherein said gate means for providing an enable signal to said RF amplifier includes means responsive to a DC pulse and to said comparator means determining that said diode switch means is in the conducting condition for enabling said RF amplifier.

7. The circuit of claim 6 wherein said gate logic means includes four NOR gates;
- a first NOR gate being operated responsive to the DC pulses to provide a "zero" output,
- a second NOR gate operated responsive to said body coil enabling signal to provide a "zero" output,
- a third NOR gate operated responsive to the output of said second NOR gate and said comparator means to provide a "zero" output responsive to said diode switch means being in the conducting condition.
- a fourth NOR gate operated responsive to the output of said first NOR gate means and said third NOR gate to provide an enabling signal responsive to the "zero" output of said first NOR gate and said third NOR gate.

8. The circuit of claim 7 wherein said comparator means provides a "0" output responsive to said diode switch means being in a non-conducting condition whereby the output of the fourth gate means is "0" to prevent enabling said RF amplifier when said diode switch means is in the non-conducting condition.

9. The circuit of claim 2 wherien said diode switch means are located at a position of current null in said body coil means.

10. The circuit of claim 2 wherein means are provided for locating said diode switch means to minimize the DC loop length thereby minimizing eddy currents and reverse EMF in the body coil.

11. The circuit of claim 1 including an RF amplifier for amplifying said RF pulses prior to transmission of said RF pulses to said body coil.

* * * * *